(12) United States Patent
Seo

(10) Patent No.: US 9,148,136 B2
(45) Date of Patent: Sep. 29, 2015

(54) SEMICONDUCTOR APPARATUS AND DUTY CYCLE CORRECTION METHOD THEREOF

(71) Applicant: SK hynix Inc., Icheon-si Gyeonggi-do (KR)

(72) Inventor: Young Suk Seo, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/846,756

(22) Filed: Mar. 18, 2013

(65) Prior Publication Data

US 2014/0152358 A1 Jun. 5, 2014

(30) Foreign Application Priority Data

Nov. 30, 2012 (KR) ........................ 10-2012-0137926

(51) Int. Cl.
*H03L 7/06* (2006.01)
*H03K 5/156* (2006.01)

(52) U.S. Cl.
CPC .................................. *H03K 5/1565* (2013.01)

(58) Field of Classification Search
CPC ......... H03L 7/0891; H03L 7/18; H03L 7/093; H03L 7/087; H03L 7/10
USPC .................................................. 327/156, 158
See application file for complete search history.

(56) References Cited

U.S. PATENT DOCUMENTS

2011/0164462 A1* 7/2011 Choi .............................. 365/194

FOREIGN PATENT DOCUMENTS

KR 100808594 B1 2/2008
KR 100911195 B1 7/2009

* cited by examiner

*Primary Examiner* — Lincoln Donovan
(74) *Attorney, Agent, or Firm* — William Park & Associates Ltd.

(57) ABSTRACT

A semiconductor apparatus includes a duty cycle correction block and a delay locked loop. The duty cycle correction block generates a duty corrected clock by correcting a duty cycle of an internal clock, adjusts a phase of a rising edge of the duty corrected clock when a delay locked loop is reset, and adjusts a phase of a falling edge of the duty corrected clock when the delay locked loop is locked. The delay locked loop receives an external clock to output the internal clock, and delays the external clock by a variable delay amount to output the internal clock when the adjustment of the phase of the rising edge of the duty corrected clock by the duty cycle correction block is completed.

19 Claims, 9 Drawing Sheets

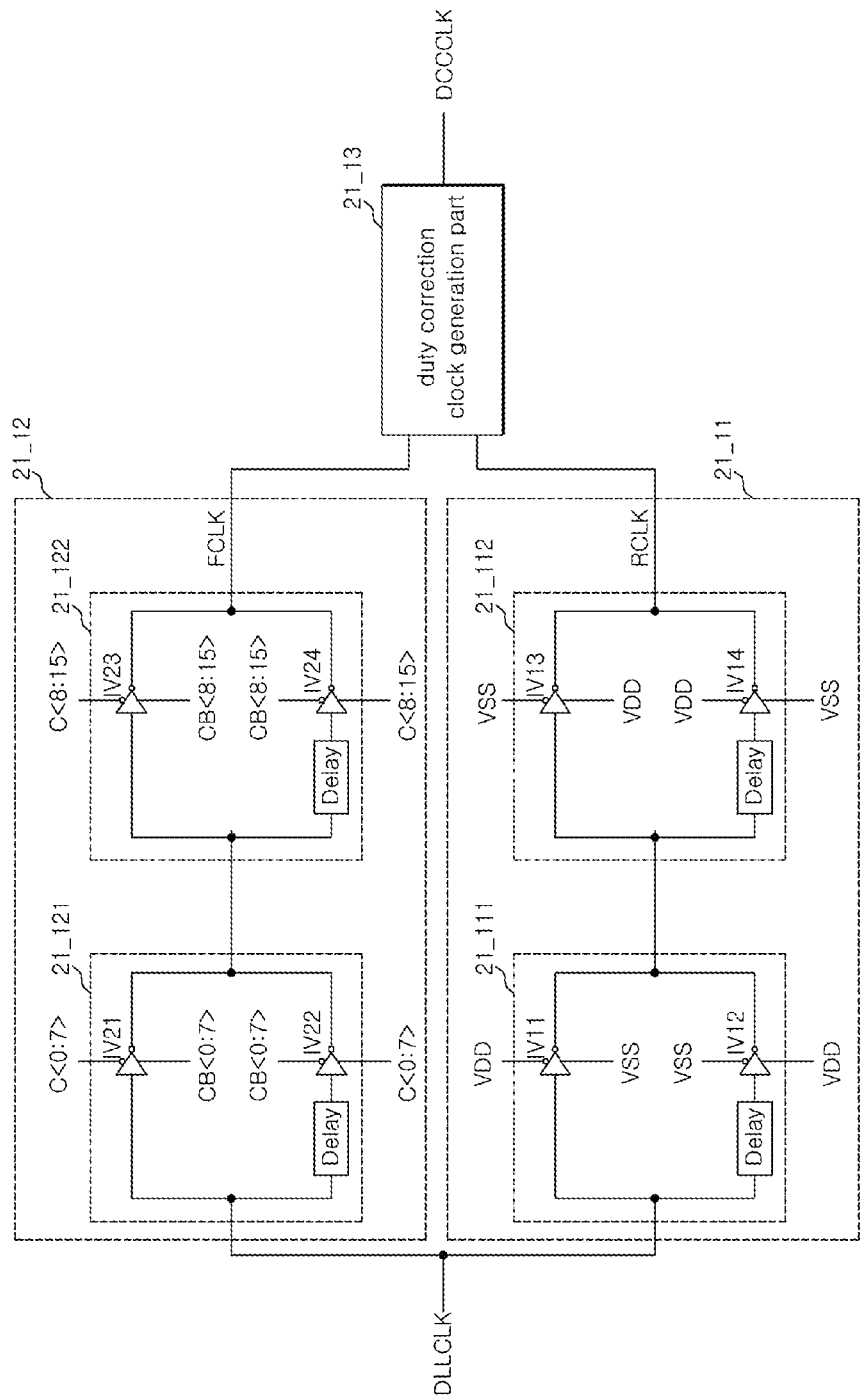

FIG.6
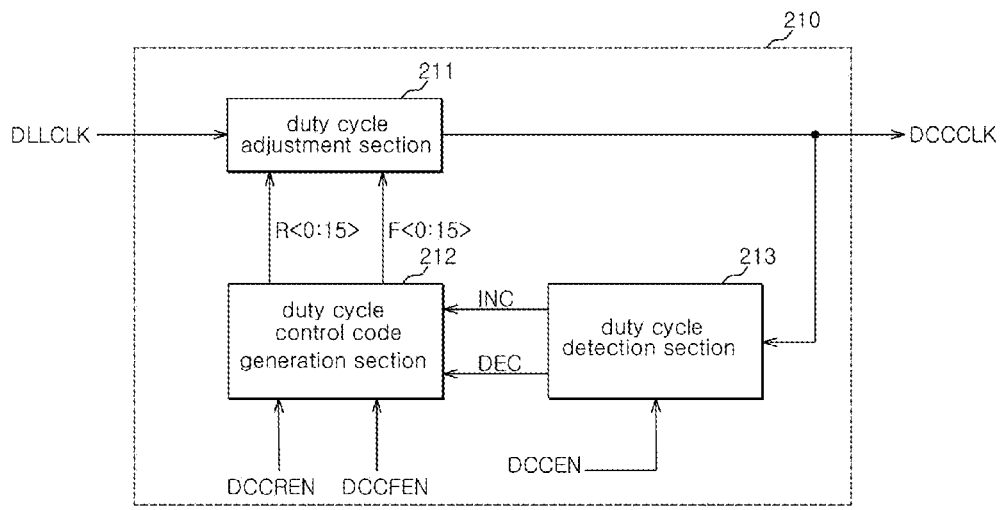
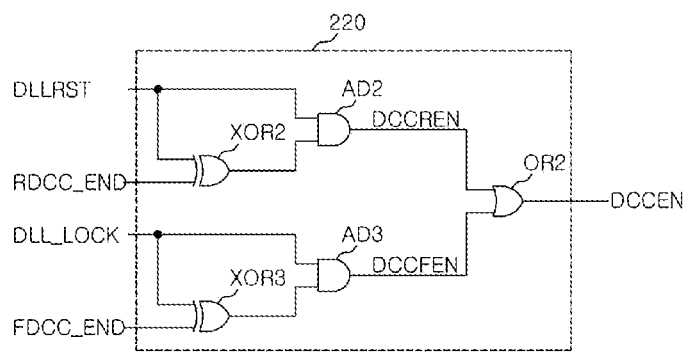
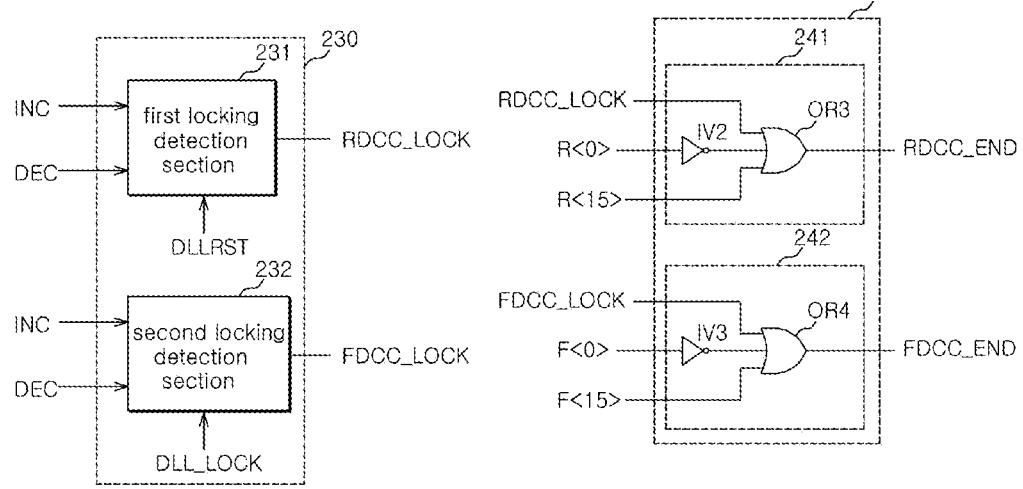

SEMICONDUCTOR APPARATUS AND DUTY CYCLE CORRECTION METHOD THEREOF

CROSS-REFERENCE TO RELATED APPLICATION

The present application claims priority under 35 U.S.C. §119(a) to Korean application number 10-2012-0137926 filed on Nov. 30, 2012 in the Korean Intellectual Property Office, which is incorporated herein by reference in its entirety.

BACKGROUND

1. Technical Field

Various embodiments relate generally to a semiconductor apparatus, and more particularly to a clock duty cycle correction method of a semiconductor apparatus.

2. Related Art

A duty cycle of a clock represents a ratio of a pulse width with respect to a pulse cycle of the clock. In other words, the duty cycle is the ratio of the duration of an active state to the total period of a clock signal. In general, a digital clock having a duty cycle of 50:50 is used in a semiconductor integrated circuit, which indicates that the width of a high level period of the clock is substantially equal to the width of a low level period of the clock.

In some digital electronic devices, it is important to precisely control the duty cycle of the clock to be 50:50. For example, in a synchronous semiconductor apparatus in which data is input/output in synchronization with a clock, when the duty cycle of the clock is not precisely controlled, data may be distorted.

Recently, in order to improve an operation speed, a DDR (Double Data Rate) synchronous semiconductor apparatus is being used. Since data is input/output at a falling edge of a clock as well as a rising edge of the clock, there is a need to sufficiently ensure a data margin by controlling the duty cycle of the clock.

SUMMARY

In an embodiment, a duty cycle correction method of a semiconductor apparatus includes: a first duty cycle correction step of adjusting a phase of a rising edge of a duty corrected clock when generating the duty corrected clock by correcting a duty cycle of an external clock; a delay locking step of delaying the external clock by a variable delay amount and generating a locked DLL clock; and a second duty cycle correction step of adjusting a phase of a falling edge of the duty corrected clock when generating the duty corrected clock by correcting a duty cycle of the DLL clock.

In another embodiment, a semiconductor apparatus includes: a duty cycle correction block configured to generate a duty corrected clock by correcting a duty cycle of an internal clock, to adjust a phase of a rising edge of the duty corrected clock when a delay locked loop is reset, and to adjust a phase of a falling edge of the duty corrected clock when the delay locked loop is locked; and the delay locked loop configured to receive an external clock to output the internal clock, and to delay the external clock by a variable delay amount to output the internal clock when adjustment of the phase of the rising edge of the duty corrected clock by the duty cycle correction block is completed.

BRIEF DESCRIPTION OF THE DRAWINGS

Features, aspects, and embodiments are described in conjunction with the attached drawings, in which:

FIG. 3 is a circuit diagram illustrating a detailed example of a duty cycle adjustment section of FIG. 2;

FIG. 6 is a block diagram illustrating a detailed example of a duty cycle correction block of FIG. 5;

DETAILED DESCRIPTION

Hereinafter, a semiconductor apparatus and a clock duty cycle correction method thereof according to various embodiments of the present invention will be described in detail with reference to the accompanying drawings.

When an external clock is applied to an internal operation of the semiconductor apparatus, clock skew may occur in output data due to various internal signal delays. In order to compensate for the clock skew, the semiconductor apparatus may generate an internal clock through a delay locked loop (DLL), which compensates for the clock skew by a model delay value tREP obtained by modeling a delay amount of a data output path of the semiconductor apparatus from an external clock, thereby generating a DLL clock. The DLL clock may be used in an internal operation of the semiconductor apparatus to output data to an outside source in synchronization with the external clock.

Figure 1:
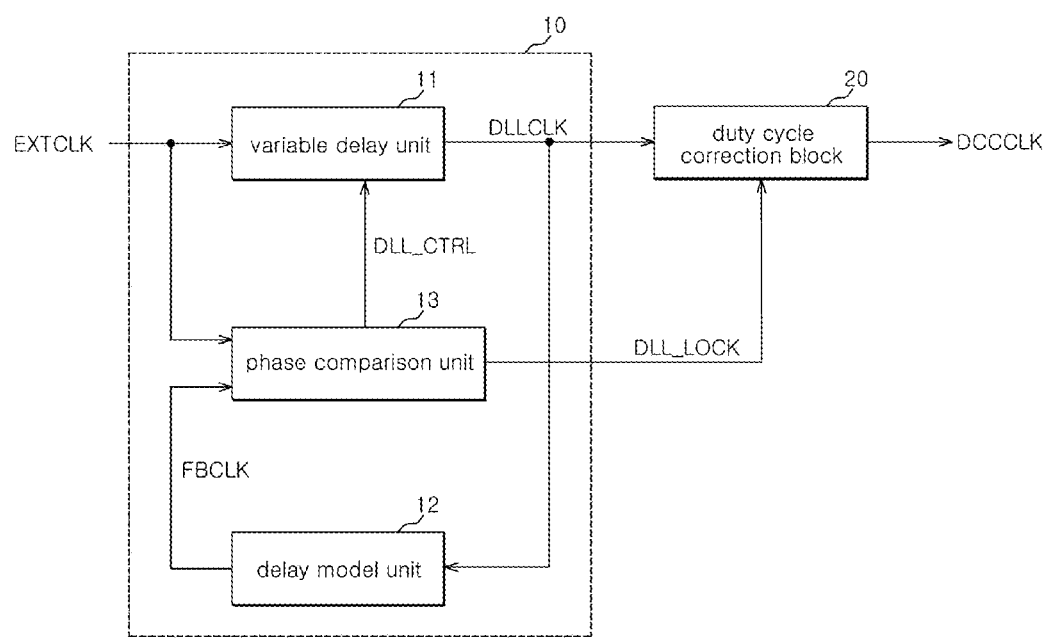
FIG. 1 is a block diagram of a semiconductor apparatus according to an embodiment of the present invention.

In FIG. 1, the semiconductor apparatus may include a delay locked loop 10 and a duty cycle correction block 20.

The delay locked loop 10 may be configured to delay an external clock EXTCLK by a variable delay amount and generate an internal clock DLLCLK. A model delay value tREP, obtained by modeling a delay amount of a data output path of the semiconductor apparatus in n (n is a natural number) cycles of the external clock EXTCLK, is a factor in determining a value of the variable delay amount.

The duty cycle correction block 20 is configured to receive the internal clock DLLCLK, correct a duty cycle of the internal clock DLLCLK when the delay locked loop 10 is locked, and to output a duty corrected clock DCCCLK.

That is, the semiconductor apparatus according to an embodiment is able to correct the duty cycle of the internal clock DLLCLK generated by the delay locked loop 10.

The delay locked loop 10 may include a variable delay unit 11, a delay model unit 12, and a phase comparison unit 13.

The variable delay unit 11 may be configured to delay the external clock EXTCLK in response to a delay amount adjustment signal DLL_CTRL, and to generate the internal clock DLLCLK.

The delay model unit 12 may be configured to delay the internal clock DLLCLK by the model delay value tREP, and to generate a feedback clock FBCLK.

The phase comparison unit 13 may be configured to compare a phase of the external clock EXTCLK with a phase of the feedback clock FBCLK, and to generate the delay amount adjustment signal DLL_CTRL according to a result of the comparison. The phase comparison unit 13 may further be configured to change the delay amount adjustment signal DLL_CTRL until the phase of the external clock EXTCLK coincides with the phase of the feedback clock FBCLK. When the phase of the external clock EXTCLK coincides with the phase of the feedback clock FBCLK, the phase comparison unit 13 locks the value of the delay amount adjustment signal DLL_CTRL and activates a DLL locking signal DLL_LOCK so that the delay locked loop is locked.

Figure 2:
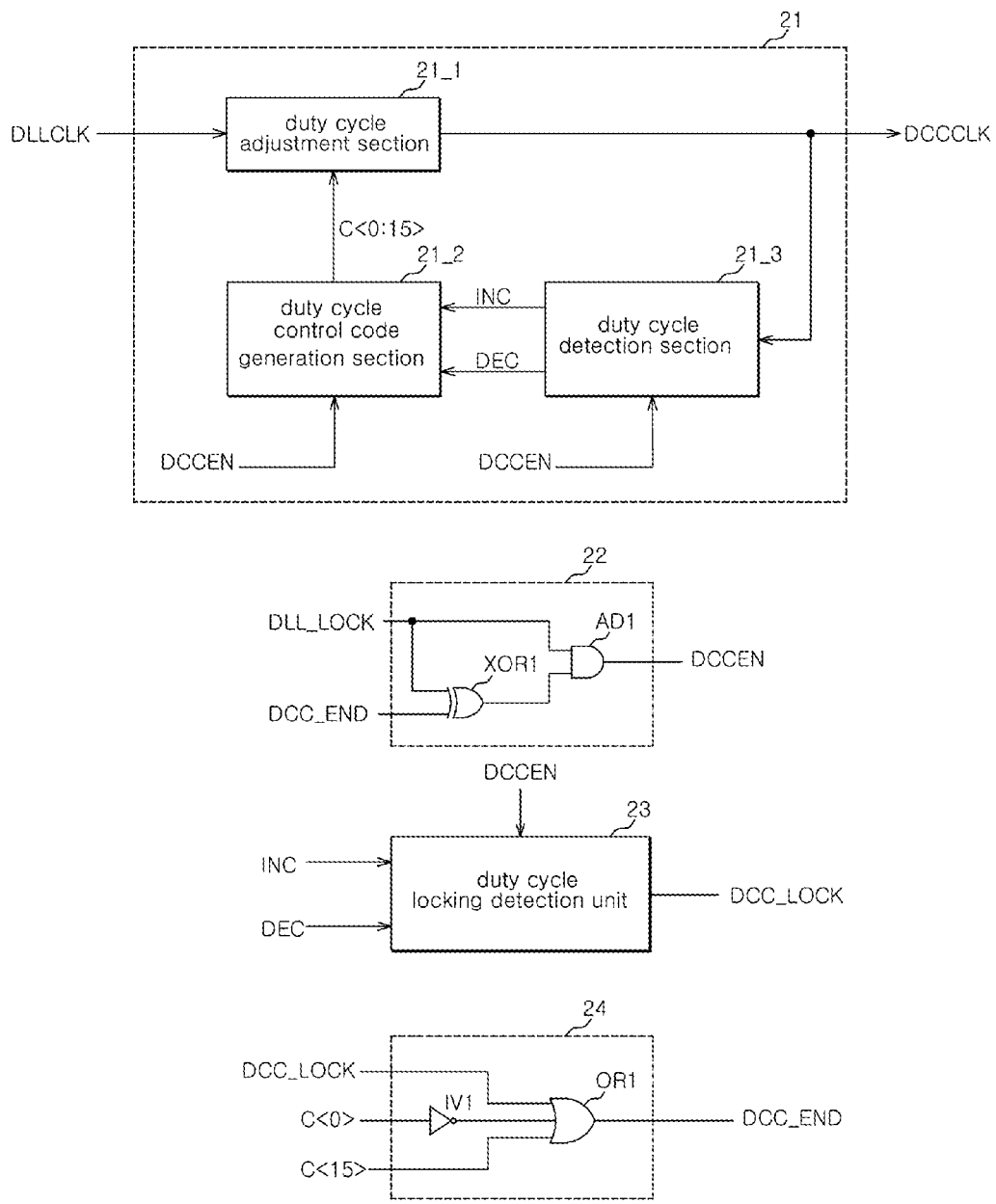
FIG. 2 is a block diagram illustrating a detailed example of a duty cycle correction block of FIG. 1.

In FIG. 2, the duty cycle correction block 20 may include a correction unit 21.

The correction unit 21 may include a duty cycle adjustment section 21_1, a duty cycle control code generation section 21_2, and a duty cycle detection section 21_3.

The duty cycle detection section 21_3 may be configured to detect a duty cycle of the duty corrected clock DCCCLK and generate an increment signal INC and/or a decrement signal DEC when a duty cycle correction enable signal DCCEN is activated. For example, when the duty cycle of the duty corrected clock DCCCLK is greater than 50% (50% duty cycle indicates a signal that is active 50% of a period of time under consideration) the duty cycle detection section 21_3 may activate the decrement signal DEC. When the duty cycle of the duty corrected clock DCCCLK is less than 50%, the duty cycle detection section 21_3 may activate the increment signal INC.

The duty cycle control code generation section 21_2 may be configured to adjust and output duty cycle control codes C<0:15> in response to the increment signal INC and/or the decrement signal DEC when the duty cycle correction enable signal DCCEN is activated. In the duty cycle control codes C<0:15>, the codes C<0:7> may be set to a high level as an initial value and the codes C<8:15> may be set to a low level as an initial value.

The duty cycle adjustment section 21_1 may be configured to correct the duty cycle of the internal clock DLLCLK in response to the duty cycle control codes C<0:15>, and to generate the duty corrected clock DCCCLK. A detailed configuration of the duty cycle adjustment section 21_1 will be described below.

The duty cycle correction block 20 may further include a duty cycle correction enable signal generation unit 22, a duty cycle locking detection unit 23, and a duty cycle correction end signal generation unit 24.

The duty cycle locking detection unit 23 may be configured to detect a variation in the increment signal INC and the decrement signal DEC in response to an activated duty cycle correction enable signal DCCEN, and to generate a duty cycle locking signal DCC_LOCK. A continuous variation detected in the increment signal INC and/or the decrement signal DEC may represent that the duty cycle is being adjusted to 50%. The duty cycle locking detection unit 23 then may activate the duty cycle locking signal DCC_LOCK.

The duty cycle correction end signal generation unit 24 may be configured to activate a duty cycle correction end signal DCC_END in response to an activated duty cycle locking signal DCC_LOCK. Moreover, when the code C<0> of the duty cycle control codes C<0:15> is changed to a low level or the code C<15> of the duty cycle control codes C<0:15> is changed to a high level, the duty cycle correction end signal generation unit 24 may activate the duty cycle correction end signal DCC_END. This may be because there is no more duty cycle correction, which can be made using the duty cycle control codes C<0:15>, available.

The duty cycle correction end signal generation unit 24 may include an inverter IV1 configured to invert the code C<0>, and an OR gate OR1 configured to receive the duty cycle locking signal DCC_LOCK, the inverted code C<0> and the code C<15> and output the duty cycle correction end signal DCC_END.

The duty cycle correction enable signal generation unit 22 may be configured to activate the duty cycle correction enable signal DCCEN in response to an activated DLL locking signal DLL_LOCK, and to deactivate the duty cycle correction enable signal DCCEN when the duty cycle correction end signal DCC_END is activated.

The duty cycle correction enable signal generation unit 22 may include an exclusive OR gate XOR1 and an AND gate AD1. The exclusive OR gate XOR1 may be configured to receive the DLL locking signal DLL_LOCK and the duty cycle correction end signal DCC_END. The AND gate AD1 may be configured to receive the DLL locking signal DLL_LOCK and an output signal of the exclusive OR gate XOR1, and to output the duty cycle correction enable signal DCCEN.

In FIG. 3, the duty cycle adjustment section 21_1 may include a first clock adjustment part 21_11, a second clock adjustment part 21_12, and a duty correction clock generation part 21_13.

The first clock adjustment part 21_11 may be configured to adjust the phase of the internal clock DLLCLK and output a first clock RCLK. The first clock adjustment part 21_11 may adjust the phase of the internal clock DLLCLK by a predetermined delay amount, e.g., by a locked delay amount.

The second clock adjustment part 21_12 may be configured to adjust the phase of the internal clock DLLCLK in response to the duty cycle control codes C<0:15> and output a second clock FCLK.

The duty correction clock generation part 21_13 may be configured to generate a duty corrected clock DCCCLK which rises at a rising edge of the first clock RCLK and falls at a falling edge of the second clock FCLK.

Since the internal clock DLLCLK is generated by adjusting the phase in consideration of the delay amount of the data output path, when the phase of a rising edge of the duty corrected clock DCCCLK is adjusted to adjust a duty cycle thereof, a data output timing matched by the delay locked loop 10 needs to be readjusted.

Accordingly, the duty cycle adjustment section 21_1 according to an embodiment may adjust the duty cycle by changing the phase of the falling edge of the duty corrected clock DCCCLK without changing the phase of the rising edge thereof.

The first clock adjustment part 21_11 may be configured to generate the first clock RCLK for determining the phase of the rising edge of the duty corrected clock DCCCLK. Accordingly, the delay amount at the first clock adjustment part 21_11 may be locked and not changed by the duty cycle control codes C<0:15>. The locked delay amount should be set such that the phase of the duty corrected clock DCCCLK is substantially equal to the phase of the internal clock DLLCLK.

The first clock adjustment part 21_11 may include a first phase adjustment portion 21_111 and a second phase adjustment portion 21_112.

The first phase adjustment portion 21_111 may include first and second inverters IV11 and IV12 and a delay Delay. The first inverter IV11 may be configured to output the internal clock DLLCLK without having passed through the delay Delay and the second inverter IV12 may be configured to output an internal clock DLLCLK having passed through the delay Delay. The first and second inverters IV11 and IV12 may mix phases of clocks according to weights. In the first phase adjustment portion 21_111, a weight may be locked by an external voltage VDD and a ground voltage VSS.

The second phase adjustment portion 21_112 also may include third and fourth inverters IV13 and IV14 and a delay Delay. The third inverter IV13 may be configured to output a signal in response to the output of the first phase adjustment portion 21_111 which is transmitted to the third inverter IV13 without having passed through delay Delay. Unlike the third inverter IV13, the fourth inverter IV14 may be configured to output a signal in response to the output of the first phase adjustment portion 21_111 having passed through the delay Delay. The third and fourth inverters IV13 and IV14 may mix phases of clocks according to weights. For example, in the second phase adjustment portion 21_112, a weight may be locked by the external voltage VDD and the ground voltage VSS.

The second clock adjustment part 21_12 may be configured to generate the second clock FCLK for determining the phase of the falling edge of the duty corrected clock DCCCLK. Accordingly, the delay amount at the second clock adjustment part 21_12 is determined according to the duty cycle control codes C<0:15>.

The second clock adjustment part 21_12 may include a third phase adjustment portion 21_121 and a fourth phase adjustment portion 21_122.

The third phase adjustment portion 21_121 may include fifth and sixth inverters IV21 and IV22 and a delay Delay. The fifth inverter IV21 may be configured to output the internal clock DLLCLK without having passed through delay Delay and the sixth inverter IV22 may be configured to output an internal clock DLLCLK having passed through the delay Delay. The fifth and sixth inverters IV21 and IV22 may mix phases of clocks according to weights. For example, in the third phase adjustment portion 21_121, a weight may be determined according to the codes C<0:7> of the duty cycle control codes C<0:15>. When all the codes C<0:7> have been initially set to a high level and then are sequentially changed to a low level, the phase of the second clock FCLK may shift.

The fourth phase adjustment portion 21_122 also may include seventh and eighth inverters IV23 and IV24 and a delay Delay. The seventh inverter IV23 may be configured to output a signal in response to the output of the third phase adjustment portion 21_121 which is transmitted to the seventh inverter IV23 without having passed through delay Delay. Unlike the seventh inverter IV23, the eighth inverter IV24 may be configured to output a signal in response to the output of the third phase adjustment portion 21_121 having passed through the delay Delay. The seventh and eighth inverters IV23 and IV24 may mix phases of clocks according to weights. For example, in the fourth phase adjustment portion 21_122, a weight may be determined according to the codes C<8:15> of the duty cycle control codes C<0:15>. When all the codes C<8:15> have been initially set to a low level and then are sequentially changed to a high level, the phase of the second clock FCLK may shift.

That is, the duty cycle adjustment section 21_1 according to an embodiment adjusts the duty cycle by changing the phase of the falling edge of the duty corrected clock DCCCLK without changing the phase of the rising edge thereof.

Figure 4A:
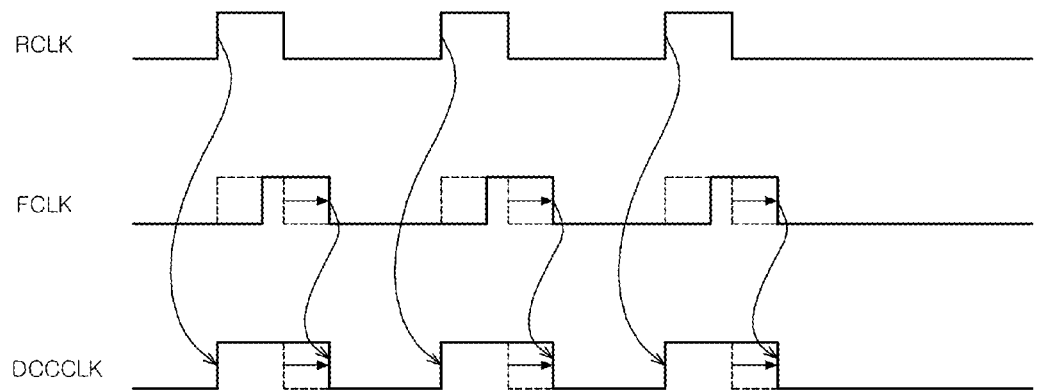
FIG. 4a and FIG. 4b are waveform diagrams illustrating the operation of a duty cycle adjustment section of FIG. 3.

FIG. 4a illustrates the duty cycle of a clock that is less than 50%.

In order to correct the duty cycle of the clock to 50%, the duty cycle adjustment section 21_1 may shift the phase of the falling edge of the duty corrected clock DCCCLK.

The duty cycle adjustment section 21_1 may not change the phase of the first clock RCLK for determining the phase of the rising edge of the duty corrected clock DCCCLK, and may shift the phase of the second clock FCLK for determining the phase of the falling edge of the duty corrected clock DCCCLK by a predetermined amount.

Figure 4B:
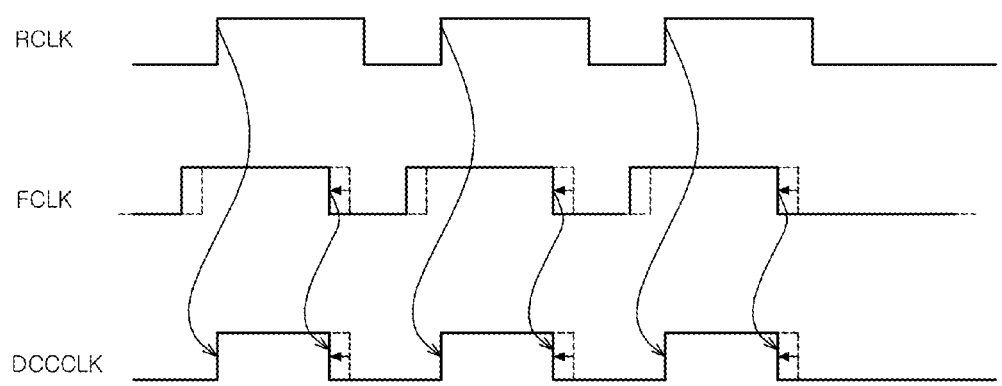

FIG. 4b illustrates the duty cycle of the clock that is greater than 50%.

In order to correct the duty cycle of the clock to 50%, the duty cycle adjustment section 21_1 may shift the phase of the falling edge of the duty corrected clock DCCCLK.

The duty cycle adjustment section 21_1 may not change the phase of the first clock RCLK for determining the phase of the rising edge of the duty corrected clock DCCCLK, and may shift the phase of the second clock FCLK for determining the phase of the falling edge of the duty corrected clock DCCCLK by a predetermined amount.

However, in the method for correcting the duty cycle by changing only the phase of the falling edge of the duty corrected clock DCCCLK, a correction range of the duty cycle may be limited. In efforts to widen the correction range, when the delay locked loop 10 is locked and then the phase of the rising edge of the duty corrected clock DCCCLK is changed, a data output timing error may occur.

Figure 5:
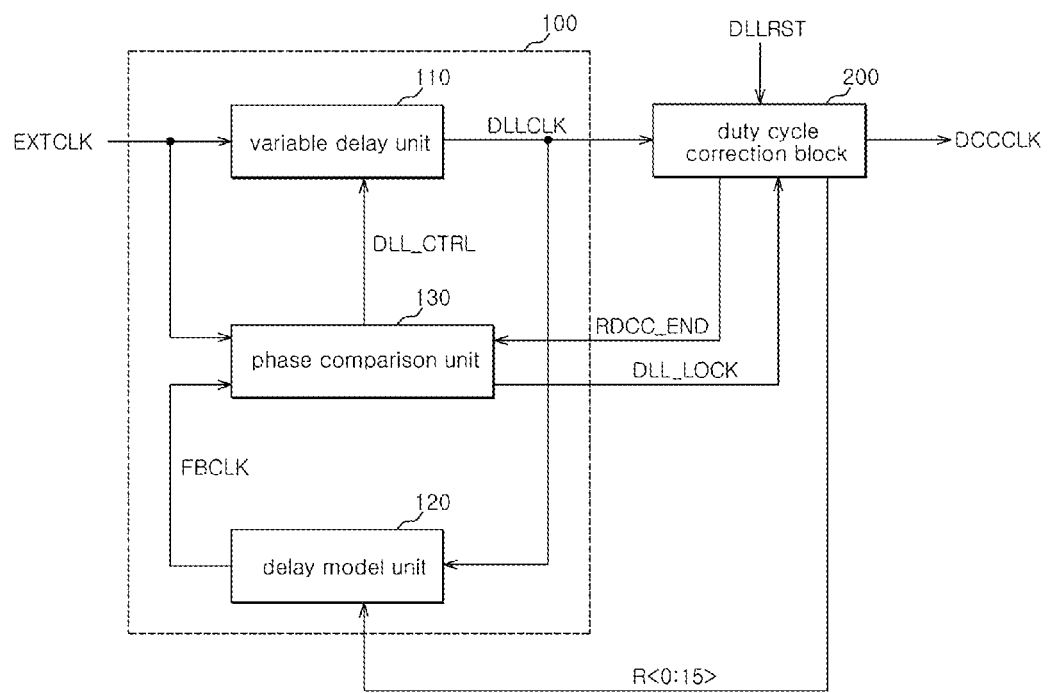
FIG. 5 is a block diagram of a semiconductor apparatus according to another embodiment of the present invention.

In FIG. 5, the semiconductor apparatus may include a delay locked loop 100 and a duty cycle correction block 200.

The delay locked loop 100 may be configured to receive an external clock EXTCLK and generate an internal clock DLLCLK. In a deactivated state, the delay locked loop 100 may output the external clock EXTCLK as the internal clock DLLCLK. In an activated state, the delay locked loop 100 may delay the external clock EXTCLK by a variable delay amount and output the internal clock DLLCLK. A model delay value tREP, obtained by modeling a delay amount of a data output path of the semiconductor apparatus in n (n is a natural number) cycles of the external clock EXTCLK, is a factor in determining a value of the variable delay amount. The delay locked loop 100 may be activated when an activated first duty cycle correction end signal RDCC_END is applied from the duty cycle correction block 200.

The duty cycle correction block 200 may be configured to receive the internal clock DLLCLK, to correct a duty cycle of the internal clock DLLCLK, and to output a duty corrected clock DCCCLK. The duty cycle correction block 200 according to an embodiment may adjust a phase of a rising edge of the duty corrected clock DCCCLK in response to a DLL reset signal DLLRST. Here, the DLL reset signal DLLRST may be used for resetting the delay locked loop 100. Also, the duty cycle correction block 200 may adjust a phase of a falling edge of the duty corrected clock DCCCLK in response to a DLL locking signal which is activated when the delay locked loop 100 is locked, thereby correcting the duty cycle.

The delay locked loop 100 may include a variable delay unit 110, a delay model unit 120, and a phase comparison unit 130.

The variable delay unit 110 may be configured to delay the external clock EXTCLK in response to a delay amount adjustment signal DLL_CTRL, and to generate the internal clock DLLCLK.

The delay model unit 120 may be configured to delay the internal clock DLLCLK by the model delay value tREP, and to generate a feedback clock FBCLK. The delay model unit 120 may be configured to adjust the model delay value in response to first duty cycle control codes R<0:15>, which will be described in detail later.

The phase comparison unit 130 may be configured to operate in response to a first duty cycle correction end signal RDCC_END. That is, when an activated first duty cycle correction end signal RDCC_END is received, the phase comparison unit 130 may compare a phase of the external clock EXTCLK with a phase of the feedback clock FBCLK, and may generate the delay amount adjustment signal DLL_CTRL according to a result of the comparison. The phase comparison unit 130 may be configured to change a value of the delay amount adjustment signal DLL_CTRL until the phase of the external clock EXTCLK coincides with the phase of the feedback clock FBCLK. When the phase of the external clock EXTCLK coincides with the phase of the feedback clock FBCLK, the phase comparison unit 130 locks the value of the delay amount adjustment signal DLL_CTRL, and activates a DLL locking signal DLL_LOCK so that the delay locked loop is locked.

In FIG. 6, the duty cycle correction block 200 may include a correction unit 210.

The correction unit 210 may include a duty cycle adjustment section 211, a duty cycle control code generation section 212, and a duty cycle detection section 213.

The duty cycle detection section 213 may be configured to detect a duty cycle of the duty corrected clock DCCCLK and generate an increment signal INC and/or a decrement signal DEC when a duty cycle correction enable signal DCCEN is activated. For example, when the duty cycle of the duty corrected clock DCCCLK is greater than 50%, the duty cycle detection section 213 may activate the decrement signal DEC. When the duty cycle of the duty corrected clock DCCCLK is less than 50%, the duty cycle detection section 213 may activate the increment signal INC.

The duty cycle control code generation section 212 may be configured to adjust and output the first duty cycle control codes R<0:15> in response to the increment signal INC and/or the decrement signal DEC when a first correction enable signal DCCREN is activated. Also, the duty cycle control code generation section 212 may be configured to adjust and output second duty cycle control codes F<0:15> in response to the increment signal INC and/or the decrement signal DEC when a second correction enable signal DCCFEN is activated. In the first and second duty cycle control codes R<0:15> and F<0:15>, the codes R<0:7> and F<0:7> may be set to a high level as an initial value and the codes R<8:15> and F<8:15> may be set to a low level as an initial value.

The duty cycle adjustment section 211 may be configured to correct the duty cycle of the internal clock DLLCLK in response to the first and second duty cycle control codes R<0:15> and F<0:15>, and to generate the duty corrected clock DCCCLK. The duty cycle adjustment section 211 may adjust the phase of a rising edge of the duty corrected clock DCCCLK in response to the first duty cycle control codes R<0:15>, and may adjust the phase of a falling edge of the duty corrected clock DCCCLK in response to the second duty cycle control codes F<0:15>. A detailed configuration of the duty cycle adjustment section 211 will be described below.

The duty cycle correction block 200 may further include a duty cycle correction enable signal generation unit 220, a duty cycle locking detection unit 230, and a duty cycle correction end signal generation unit 240.

The duty cycle locking detection unit 230 may include a first locking detection section 231 and a second locking detection section 232.

The first locking detection section 231 may be configured to detect a variation in the increment signal INC and the decrement signal DEC and generate a first duty cycle locking signal RDCC_LOCK in response to an activated DLL reset signal DLLRST. A continuous variation detected in the increment signal INC and/or the decrement signal DEC may represent that the duty cycle is being adjusted to 50%. The first locking detection section 231 then may activate the first duty cycle locking signal RDCC_LOCK.

The second locking detection section 232 may be configured to detect a variation in the increment signal INC and the decrement signal DEC and generate a second duty cycle locking signal FDCC_LOCK in response to an activated DLL locking signal DLL_LOCK. A continuous variation detected in the increment signal INC and/or the decrement signal DEC may represent that the duty cycle is being adjusted to 50%. The second locking detection section 232 then may activate the second duty cycle locking signal FDCC_LOCK.

The duty cycle correction end signal generation unit 240 may include a first duty cycle correction end signal generation section 241 and a second duty cycle correction end signal generation section 242.

The first duty cycle correction end signal generation section 241 may be configured to activate the first duty cycle correction end signal RDCC_END in response to an activated first duty cycle locking signal RDCC_LOCK. Moreover, when the code R<0> of the first duty cycle control codes R<0:15> is changed to a low level or the code R<15> of the first duty cycle control codes R<0:15> is changed to a high level, the first duty cycle correction end signal generation section 241 may activate the first duty cycle correction end signal RDCC_END. This may be because there is no more duty cycle correction, which can be made using the first duty cycle control codes R<0:15>, available.

The first duty cycle correction end signal generation section 241 may include an inverter IV2 configured to invert the code R<0>, and an OR gate OR3 configured to receive the first duty cycle locking signal RDCC_LOCK, the inverted code R<0>, and the code R<15> and output the first duty cycle correction end signal RDCC_END.

The second duty cycle correction end signal generation section 242 may be configured to activate a second duty cycle correction end signal FDCC_END in response to an activated second duty cycle locking signal FDCC_LOCK. Moreover, when the code F<0> of the second duty cycle control codes F<0:15> is changed to a low level or the code F<15> of the second duty cycle control codes F<0:15> is changed to a high level, the second duty cycle correction end signal generation section 242 may activate the second duty cycle correction end signal FDCC_END. This may be because there is no more duty cycle correction, which can be made using the second duty cycle control codes F<0:15>, available.

The second duty cycle correction end signal generation section 242 may include an inverter IV3 configured to invert the code F<0>, and an OR gate OR4 configured to receive the second duty cycle locking signal FDCC_LOCK, the inverted code F<0> and the code F<15> and output the second duty cycle correction end signal FDCC_END.

The duty cycle correction enable signal generation unit 220 may be configured to activate the first correction enable signal DCCREN in response to the DLL reset signal DLLRST, and to deactivate the first correction enable signal DCCREN activated in response to the first duty cycle correction end signal RDCC_END. Furthermore, the duty cycle correction enable signal generation unit 220 may be configured to activate the second correction enable signal DCCFEN in response to the DLL locking signal DLL_LOCK. Also, the duty cycle correction enable signal generation unit 220 may be configured to deactivate the second correction enable signal DCCFEN activated in response to the second duty cycle correction end signal FDCC_END. Furthermore, when one of the first and second correction enable signals DCCREN and DCCFEN is activated, the duty cycle correction enable signal generation unit 220 may activate the duty cycle correction enable signal DCCEN.

The duty cycle correction enable signal generation unit 220 may include first and second exclusive OR gates XOR2 and XOR3, first and second AND gates AD2 and AD3, and an OR gate OR2.

The first exclusive OR gate XOR2 may be configured to receive the DLL reset signal DLLRST and the first duty cycle correction end signal RDCC_END. The first AND gate AD2 may be configured to receive the DLL reset signal DLLRST and an output signal of the first exclusive OR gate XOR2, and to output the first correction enable signal DCCREN.

The second exclusive OR gate XOR3 may be configured to receive the DLL locking signal DLL_LOCK and the second duty cycle correction end signal FDCC_END. The second AND gate AD3 may be configured to receive the DLL locking signal DLL_LOCK and an output signal of the second exclusive OR gate XOR3, and to output the second correction enable signal DCCFEN.

The OR gate OR2 may be configured to receive the first and second correction enable signals DCCREN and DCCFEN and output the duty cycle correction enable signal DCCEN.

Figure 7:
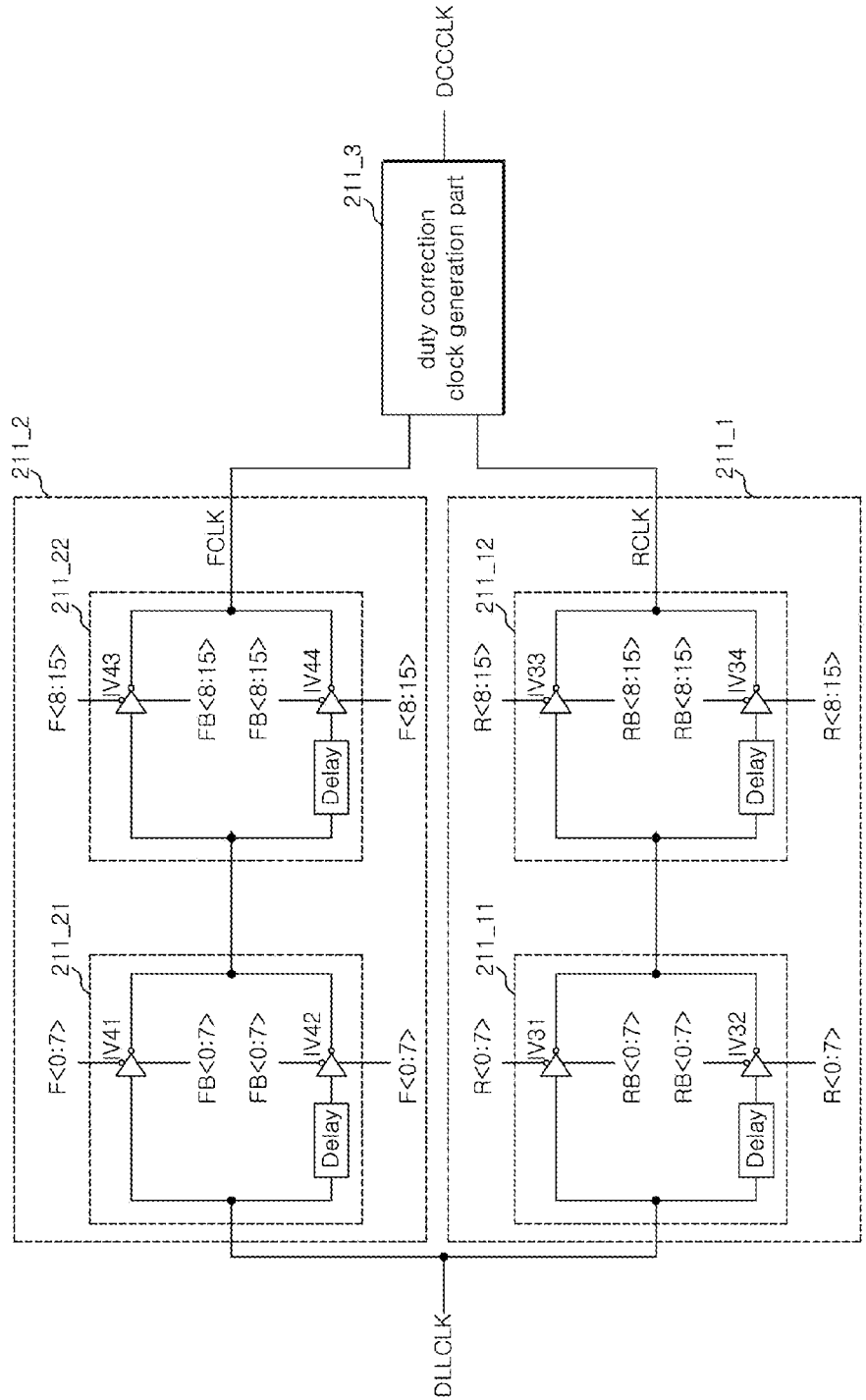
FIG. 7 is a circuit diagram illustrating a detailed example of a duty cycle adjustment section of FIG. 6.

In FIG. 7, the duty cycle adjustment section 211 may include a first clock adjustment part 211_1, a second clock adjustment part 211_2, and a duty correction clock generation part 211_3.

The first clock adjustment part 211_1 may be configured to adjust the phase of the internal clock DLLCLK in response to the first duty cycle control codes R<0:15>, and to output a first clock RCLK.

The second clock adjustment part 211_2 may be configured to adjust the phase of the internal clock DLLCLK in response to the second duty cycle control codes F<0:15>, and to output a second clock FCLK.

The duty correction clock generation part 211_3 may be configured to generate a duty corrected clock DCCCLK which rises at a rising edge of the first clock RCLK and falls at a falling edge of the second clock FCLK.

The first clock adjustment part 211_1 may be configured to generate the first clock RCLK for determining the phase of the rising edge of the duty corrected clock DCCCLK. Accordingly, the delay amount at the first clock adjustment part 211_1 is determined in response to the first duty cycle control codes R<0:15>.

The first clock adjustment part 211_1 may include a first phase adjustment portion 211_11 and a second phase adjustment portion 211_12.

The first phase adjustment portion 211_11 may include first and second inverters IV31 and IV32 and a delay Delay. The first inverter IV31 may be configured to output the internal clock DLLCLK without having passed through the delay Delay and the second inverter IV32 may be configured to output an internal clock DLLCLK having passed through the delay Delay. The first and second inverters IV31 and IV32 may mix phases of clocks according to weights. In the first phase adjustment portion 211_11, a weight may be determined according to the codes R<0:7> of the first duty cycle control codes R<0:15>. When all the codes R<0:7> have been initially set to a high level and then are sequentially changed to a low level, the phase of the first clock RCLK may shift.

The second phase adjustment portion 211_12 also includes third and fourth inverters IV33 and IV34, and a delay Delay. The third inverter IV33 is configured to output a signal in response to the output of the first phase adjustment portion 211_11 which is transmitted to the third inverter IV33 without having passed through delay Delay. Unlike the third inverter IV33, the fourth inverter IV34 may be configured to output a signal in response to the output of the first phase adjustment portion 211_11 having passed through the delay Delay. The third and fourth inverters IV33 and IV34 may mix phases of clocks according to weights. For example, in the second phase adjustment portion 211_12, a weight may be determined according to the codes R<8:15> of the first duty cycle control codes R<0:15>. When all the codes R<8:15> have been initially set to a low level and then are sequentially changed to a high level, the phase of the first clock RCLK may shift.

When the phase of the rising edge of the duty corrected clock DCCCLK is changed, since this represents a change in the delay amount of the data output path of the semiconductor apparatus, the changed delay amount should be reflected in the delay model unit 120 of the delay locked loop 100. Accordingly, the first duty cycle control codes R<0:15> may be applied to the delay model unit 120, and the delay model unit 120 nay adjust the model delay value tREP in response to the first duty cycle control codes R<0:15>.

The delay model unit 120 may increase the delay amount of the model delay value when the first duty cycle control codes R<0:15> are increased, and may decrease the delay amount of the model delay value when the first duty cycle control codes R<0:15> are decreased.

The second clock adjustment part 211_2 may be configured to generate the second clock FCLK for determining the phase of the falling edge of the duty corrected clock DCCCLK. Accordingly, the delay amount at the second clock adjustment part 211_2 is determined according to the second duty cycle control codes F<0:15>.

The second clock adjustment part 211_2 may include a third phase adjustment portion 211_21 and a fourth phase adjustment portion 211_22.

The third phase adjustment portion 211_21 may include fifth and sixth inverters IV41 and IV42 and a delay Delay. The fifth inverter IV41 may be configured to output the internal clock DLLCLK without having passed through delay Delay and the sixth inverter IV42 may be configured to output an internal clock DLLCLK having passed through the delay Delay. The fifth and sixth inverters IV41 and IV42 may mix phases of clocks according to weights. For example, in the third phase adjustment portion 211_21, a weight may be determined according to the codes F<0:7> of the second duty cycle control codes F<0:15>. When all the codes F<0:7> have been initially set to a high level and then are sequentially changed to a low level, the phase of the second clock FCLK may shift.

The fourth phase adjustment portion 211_22 may include seventh and eighth inverters IV43 and IV44 and a delay Delay. The seventh inverter IV43 may be configured to output a signal in response to the output of the third phase adjustment portion 211_21 which is transmitted to the seventh inverter IV43 without having passed through Delay. Unlike the seventh inverter IV43, the eighth inverter IV44 may be configured to output a signal in response to the output of the third phase adjustment portion 211_21 having passed through the delay Delay. The seventh and eighth inverters IV43 and IV44 may mix phases of clocks according to weights. For example, in the fourth phase adjustment portion 211_22, a weight may be determined according to the codes F<8:15> of the second duty cycle control codes F<0:15>. When all the codes F<8:15> have been initially set to a low level and then are sequentially changed to a high level, the phase of the second clock FCLK may shift.

Figure 8A:
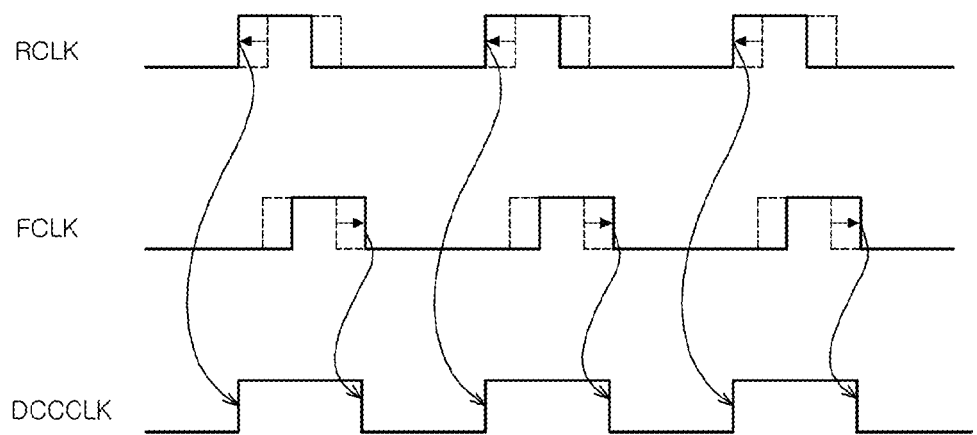
FIG. 8a and FIG. 8b are waveform diagrams illustrating the operation of a duty cycle adjustment section of FIG. 7.

FIG. 8a illustrates the duty cycle of a clock that is less than 50%.

In order to correct the duty cycle of the clock to 50%, the duty cycle adjustment section 211 may shift the phase of the first clock RCLK by a predetermined amount in response to the first duty cycle control codes R<0:15> in an initialization operation of the delay locked loop.

Then, when the delay locked loop operates and locks the internal clock DLLCLK, the duty cycle adjustment section 211 may shift the phase of the second clock FCLK by a predetermined amount according to the second duty cycle control codes F<0:15>.

Finally, the duty cycle of the duty corrected clock DCCCLK may be corrected to 50% and the duty corrected clock DCCCLK is output.

Figure 8B:
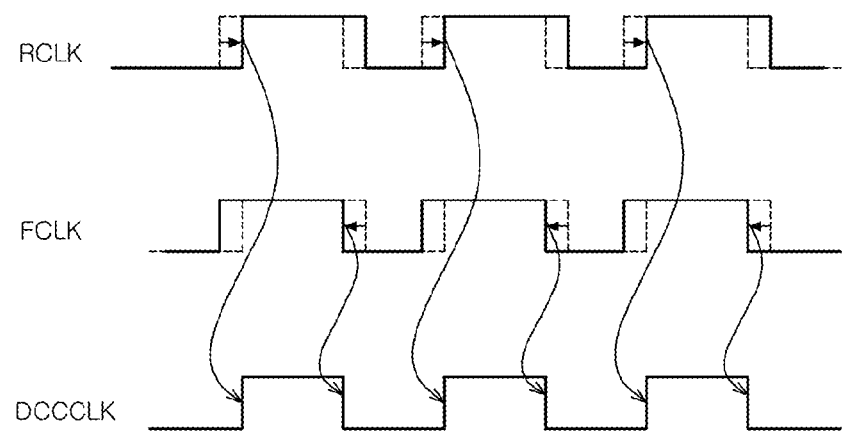

FIG. 8*b* illustrates the duty cycle of the clock that is greater than 50%.

In order to correct the duty cycle of the clock to 50%, the duty cycle adjustment section 211 may shift the phase of the first clock RCLK by a predetermined amount in response to the first duty cycle control codes R<0:15> in the initialization operation of the delay locked loop.

Then, when the delay locked loop operates and locks the internal clock DLLCLK, the duty cycle adjustment section 211 may move the phase of the second clock FCLK by a predetermined amount according to the second duty cycle control codes F<0:15>.

Finally, the duty cycle of the duty corrected clock DCCCLK may be corrected to 50% and the duty corrected clock DCCCLK is output.

The operation waveforms illustrated in FIG. 8*a* and FIG. 8*b* illustrate the operation according to an embodiment, and the invention is not limited thereto.

The duty cycle correction block 200 according to an embodiment may adjust the phase of the rising edge of the duty corrected clock DCCCLK and may correct the duty cycle of the internal clock DLLCLK before the phase of the internal clock DLLCLK is adjusted by the delay locked loop 100. Then, when the delay locked loop 100 operates and generates the internal clock DLLCLK having compensated for the delay amount of the data output path, the duty cycle correction block 200 may adjust the phase of the falling edge of the duty corrected clock DCCCLK and may re-correct the duty cycle of the internal clock DLLCLK.

That is, the duty cycle correction block 200 according to an embodiment may adjust the duty cycle by changing the phase of the rising edge or the phase of the falling edge of the duty corrected clock DCCCLK before and after the delay locked loop 100 is locked.

Figure 9:
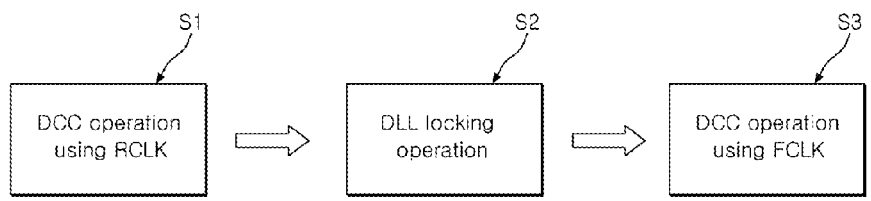
FIG. 9 is a flowchart for explaining a duty cycle correction method of a semiconductor apparatus according to an embodiment of the present invention.

As described above, the semiconductor apparatus according to an embodiment may correct the duty cycle by adjusting the phase of the rising edge of the clock before the delay locked loop operates. In FIG. 9, the semiconductor apparatus may perform first duty cycle correction by adjusting the phase of the first clock RCLK to adjust the phase of the rising edge of the duty corrected clock DCCCLK (S1).

The first duty cycle correction step (S1) may include a step of detecting the duty cycle of the duty corrected clock DCCCLK and generating the first duty cycle control codes R<0:15>, and a step of adjusting the phase of the first clock RCLK in response to the first duty cycle control codes R<0:15> and correcting the duty cycle.

When the first duty cycle correction step (S1) is completed, the semiconductor apparatus may delay the external clock EXTCLK by a variable delay amount and may generate a locked internal clock DLLCLK, e.g., a locked DLL clock, in a delay locking step (S2).

The delay locking step (S2) may include a step of adjusting the model delay value in response to the first duty cycle control codes R<0:15>, a step of delaying the DLL clock by the model delay value and generating the feedback clock FBCLK, and a step of adjusting the variable delay amount until the phase of the external clock EXTCLK coincides with the phase of the feedback clock FBCLK and generating a DLL clock.

When the delay locking step (S2) is completed, the semiconductor apparatus may adjust the phase of the falling edge of the clock to correct the duty cycle. That is, the semiconductor apparatus may perform second duty cycle correction by adjusting the phase of the second clock FCLK to adjust the phase of the falling edge of the duty corrected clock DCCCLK (S3).

The second duty cycle correction step (S3) may include a step of detecting the duty cycle of the duty corrected clock DCCCLK and generating the second duty cycle control codes F<0:15>, and a step of adjusting the phase of the second clock FCLK in response to the second duty cycle control codes F<0:15> and correcting the duty cycle.

While certain embodiments have been described above, it will be understood to those skilled in the art that the embodiments described are by way of example only. Accordingly, the semiconductor apparatus and the clock duty cycle correction method thereof described herein should not be limited based on the described embodiments.

What is claimed is:

1. A duty cycle correction method of a semiconductor apparatus, comprising:
   a first duty cycle correction step of adjusting a phase of a rising edge of a duty corrected clock when generating the duty corrected clock by correcting a duty cycle of an external clock;
   a delay locking step of delaying the external clock by a variable delay amount and generating a locked DLL clock when a first duty cycle correction end signal is enabled; and
   a second duty cycle correction step of adjusting a phase of a falling edge of the duty corrected clock when a DLL locking signal is enabled,
   wherein the first duty cycle correction step enables the first duty cycle correction end signal when the adjustment of the phase of the rising edge of the duty corrected clock is completed, and the delay locking step enables the DLL locking signal when a phase of the external clock coincides with a phase of a feedback clock.

2. The duty cycle correction method according to claim 1, wherein the first duty cycle correction step comprises the steps of:
   detecting a duty cycle of the duty corrected clock and generating a first duty cycle control code; and
   adjusting the phase of the rising edge of the duty corrected clock in response to the first duty cycle control code.

3. The duty cycle correction method according to claim 2, wherein the delay locking step comprises the steps of:
   adjusting a model delay value in response to the first duty cycle control code;
   delaying the DLL clock by the model delay value and generating a feedback clock; and
   adjusting the variable delay amount until a phase of the external clock coincides with a phase of the feedback clock, and generating the DLL clock.

4. The duty cycle correction method according to claim 1, wherein the second duty cycle correction step comprises the steps of:
   detecting the duty cycle of the duty corrected clock and generating a second duty cycle control code; and adjusting the phase of the falling edge of the duty corrected clock in response to the second duty cycle control code.

5. A semiconductor apparatus comprising:
a duty cycle correction block configured to generate a duty corrected clock by correcting a duty cycle of an internal clock, to adjust a phase of a rising edge of the duty corrected clock when a delay locked loop is reset, and to receive a DLL lock signal and adjust a phase of a falling edge of the duty corrected clock when the DLL lock signal is enabled; and
the delay locked loop configured to receive an external clock and a first duty cycle correction end signal, to output the internal clock, and to delay the external clock by a variable delay amount to output the internal clock when the first duty cycle correction end signal is enabled,
wherein the delay locked loop enables the DLL lock signal when the delay locked loop is locked, and the duty cycle correction block enables the first duty cycle correction end signal when adjustment of the phase of the rising edge of the duty corrected clock is completed.

6. The semiconductor apparatus according to claim 5, wherein the duty cycle correction block comprises:
a duty cycle correction enable signal generation unit configured to activate a duty cycle correction enable signal in response to an activated locking signal and to deactivate the duty cycle correction enable signal when a duty cycle correction end signal is activated;
a duty cycle locking detection unit configured to detect a variation in an increment signal and a decrement signal in response to the activated duty cycle correction enable signal and to generate a duty cycle locking signal; and
a duty cycle correction end signal generation unit configured to activate the duty cycle correction end signal in response to the activated duty cycle locking signal.

7. The semiconductor apparatus according to claim 5, wherein the delay locked loop comprises:
a variable delay unit configured to adjust a delay amount of the external clock in response to a delay amount adjustment signal and output the internal clock;
a delay model unit configured to delay the internal clock by a model delay value and generate a feedback clock; and
a phase comparison unit configured to compare a phase of the external clock with a phase of the feedback clock to generate the delay amount adjustment signal, and to generate a DLL locking signal which is activated when the phase of the external clock coincides with the phase of the feedback clock.

8. The semiconductor apparatus according to claim 5, wherein the duty cycle correction block comprises:
a duty cycle correction enable signal generation unit configured to activate a first correction enable signal in response to a DLL reset signal, to activate a second correction enable signal in response to the DLL locking signal, and to activate a duty cycle correction enable signal when one of the first and second correction enable signals is activated.

9. The semiconductor apparatus according to claim 8, wherein the duty cycle correction block comprises:
a correction unit configured to adjust the phase of the rising edge of the duty corrected clock in response to the first correction enable signal, and to adjust the phase of the falling edge of the duty corrected clock in response to the second correction enable signal.

10. The semiconductor apparatus according to claim 9, wherein the correction unit further comprises:

a duty cycle detection section configured to detect a duty cycle of the duty corrected clock and generate an increment signal and a decrement signal when the duty cycle correction enable signal is activated;
a duty cycle control code generation section configured to adjust a first duty cycle control code in response to the increment signal and the decrement signal when the first correction enable signal is activated, and to adjust a second duty cycle control code in response to the increment signal and the decrement signal when the second correction enable signal is activated; and
a duty cycle adjustment section configured to correct the duty cycle of the internal clock in response to the first and second duty cycle control codes.

11. The semiconductor apparatus according to claim 10, wherein the duty cycle adjustment section comprises:
a first clock adjustment part configured to adjust the phase of the internal clock in response to the first duty cycle control code and output a first clock;
a second clock adjustment part configured to adjust the phase of the internal clock in response to the second duty cycle control code and output a second clock; and
a duty correction clock generation part configured to generate the duty corrected clock which rises at a rising edge of the first clock and falls at a falling edge of the second clock.

12. The semiconductor apparatus according to claim 10, wherein the duty cycle correction block further comprises:
a first locking detection section configured to detect the increment signal and the decrement signal and generate a first duty cycle locking signal in response to an activated DLL reset signal; and
a second locking detection section configured to detect the increment signal and the decrement signal and generate a second duty cycle locking signal in response to the activated DLL locking signal.

13. The semiconductor apparatus according to claim 12, wherein the duty cycle correction block further comprises:
a first duty cycle correction end signal generation section configured to generate a first duty cycle correction end signal when the first duty cycle locking signal is activated; and
a second duty cycle correction end signal generation section configured to generate a second duty cycle correction end signal when the second duty cycle locking signal is activated.

14. The semiconductor apparatus according to claim 13, wherein the duty cycle correction enable signal generation unit is further configured to deactivate the activated first correction enable signal when the first duty cycle correction end signal is activated, and to deactivate the activated second correction enable signal when the second duty cycle correction end signal is activated.

15. The semiconductor apparatus according to claim 13, wherein the phase comparison unit is further configured to compare the phase of the external clock with the phase of the feedback clock to generate the delay amount adjustment signal in response to the activated first duty cycle correction end signal.

16. The semiconductor apparatus according to claim 10, wherein the delay model unit is further configured to adjust the model delay value in response to the first duty cycle control code.

17. The semiconductor apparatus according to claim 16, wherein the delay model unit is further configured to increase a delay amount of the model delay value when the first duty cycle control code is increased, and to decrease the delay amount of the model delay value when the first duty cycle control code is decreased.

18. A duty cycle correction method of a semiconductor apparatus, comprising:

correcting a duty cycle by adjusting a phase of a first edge of a clock and generating a duty corrected clock; and performing a delay locking by delaying the duty corrected clock by a variable delay amount when a first duty cycle correction end signal is enabled and generating a locked DLL clock, wherein correcting the duty cycle comprises:

detecting a duty cycle of the duty corrected clock, activating one of an increment signal and a decrement signal in response to a result of detecting the duty cycle of the duty corrected clock, generating a first duty cycle control code in response to the increment signal and the decrement signal, enabling the first duty cycle correction end signal in response to the increment signal and the decrement signal; and adjusting the phase of the first edge of the clock in response to the first duty cycle control code, wherein the first duty cycle correction step enables the first duty cycle correction end signal when the adjustment of the phase of a rising edge of the duty corrected clock is completed, and the delay locking step enables a DLL locking signal when a phase of the external clock coincides with a phase of a feedback clock.

19. The duty cycle correction method according to claim 18, wherein the first edge comprises a rising edge.

* * * * *